United States Patent
Oh et al.

(10) Patent No.: US 7,981,781 B2
(45) Date of Patent: Jul. 19, 2011

(54) METAL LINE OF SEMICONDUCTOR DEVICE HAVING A DIFFUSION BARRIER AND METHOD FOR FORMING THE SAME

(75) Inventors: Joon Seok Oh, Gyeonggi-do (KR); Seung Jin Yeom, Gyeonggi-do (KR); Jae Hong Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/471,801

(22) Filed: May 26, 2009

(65) Prior Publication Data
US 2010/0166982 A1   Jul. 1, 2010

(30) Foreign Application Priority Data
Dec. 30, 2008   (KR) .................. 10-2008-0137363

(51) Int. Cl.
*H01L 21/44* (2006.01)
*H01L 21/425* (2006.01)
*H01L 21/4763* (2006.01)

(52) U.S. Cl. ........ 438/524; 438/627; 438/628; 438/637; 438/640; 438/643; 257/E21.165; 257/E21.294; 257/E21.584

(58) Field of Classification Search ........... 257/E21.165, 257/E21.294, E21.584
See application file for complete search history.

(56) References Cited

U.S. PATENT DOCUMENTS

| 5,938,822 | A | * | 8/1999 | Chen et al. | 96/11 |
| 6,518,106 | B2 | * | 2/2003 | Ngai et al. | 438/157 |
| 2006/0024953 | A1 | * | 2/2006 | Papa Rao et al. | 438/629 |
| 2007/0045854 | A1 | * | 3/2007 | Lim et al. | 257/763 |
| 2008/0277790 | A1 | * | 11/2008 | Lee | 257/751 |
| 2009/0001578 | A1 | * | 1/2009 | Jung et al. | 257/751 |
| 2009/0001579 | A1 | * | 1/2009 | Kim et al. | 257/751 |
| 2009/0001580 | A1 | * | 1/2009 | Jung et al. | 257/751 |
| 2009/0115019 | A1 | * | 5/2009 | Lee et al. | 257/522 |
| 2009/0166870 | A1 | * | 7/2009 | Kim et al. | 257/751 |
| 2009/0166871 | A1 | * | 7/2009 | Kim et al. | 257/751 |
| 2009/0283908 | A1 | * | 11/2009 | Kim et al. | 257/751 |
| 2010/0019386 | A1 | * | 1/2010 | Oh et al. | 257/751 |

FOREIGN PATENT DOCUMENTS
KR     1020040008593 A     1/2004

OTHER PUBLICATIONS

Malikov et al. "Electrical Resistivity of Epitaxial Molybdenum Film Grown by Laser Ablation Deposition", J. Appl. Phys., vol. 82, No. 11, Dec. 1, 1997, American Institute of Physics, pp. 5555-5559.*

* cited by examiner

*Primary Examiner* — Charles D Garber
*Assistant Examiner* — Mohsen Ahmadi
(74) *Attorney, Agent, or Firm* — Ladas & Parry LLP

(57) ABSTRACT

A metal line of a semiconductor device includes an insulation layer formed on a semiconductor substrate. The insulation layer has a metal line forming region. A diffusion barrier is formed on a surface of the metal line forming region of the insulation layer. The diffusion barrier includes a stack structure including an $Mo_xSi_yN_z$ layer and an Mo layer. A metal layer is formed on the diffusion barrier to fill the metal line forming region of the insulation layer.

16 Claims, 4 Drawing Sheets

METAL LINE OF SEMICONDUCTOR DEVICE HAVING A DIFFUSION BARRIER AND METHOD FOR FORMING THE SAME

CROSS-REFERENCE TO RELATED APPLICATIONS

The present application claims priority to Korean patent application number 10-2008-0137363 filed on Dec. 30, 2008, which is incorporated herein by reference in its entirety.

BACKGROUND OF THE INVENTION

The present invention relates generally to a metal line of a semiconductor device and a method for forming the same, and more particularly, to a metal line of a semiconductor device having a diffusion barrier with improved characteristics, thereby improving the characteristics and the reliability of a semiconductor device, and a method for forming the same.

In a typical semiconductor device, metal lines are formed to electrically connect elements or lines to each other, and contact plugs are formed to connect lower metal lines to upper metal lines. In order to conform to the trend towards high integration in semiconductor devices, the aspect ratio of a contact hole in which a contact plug is to be formed has increased. The increase in the aspect ratio of the contact hole leads to difficulty in forming the metal line and the contact plug, and thus the importance of the metal line and contact plug forming processes has been noted.

Aluminum and tungsten have wide use as a material for forming the metal line of a semiconductor device due to the good electrical conductivity of these materials. Recent undertaking have explored the potential of copper as a next-generation material for a metal line due to the excellent electrical conductivity and low resistance of copper when compared to aluminum and tungsten. Copper (Cu) can therefore solve the problems associated with RC (resistance-capacitance) signal delay in a semiconductor device having a high level of integration and high operating speed.

However, unlike aluminum, when copper is used as the material for a metal line copper diffuses through an insulation layer to the semiconductor substrate. Semiconductor substrates are typically made of silicon, and the diffused copper acts as a deep-level impurity and induces leakage current. Therefore, it is necessary to form a diffusion barrier at the interface between a copper layer for a metal line and the insulation layer.

Hereinbelow, a conventional method for forming a metal line of a semiconductor device will be briefly described.

After forming an insulation layer on a semiconductor substrate, a metal line forming region is defined by etching the insulation layer. Then, a diffusion barrier is formed on the insulation layer including on the surface of the metal line forming region, and a copper seed layer is formed on the diffusion barrier. Next, a copper layer is formed on the copper seed layer, and the copper layer is chemically and mechanically polished (CMP) to form a metal line comprising the copper layer is formed.

However, in the conventional method described above, as the size of cells decreases in conformance with the trend toward high integration of a semiconductor device, the thickness of the diffusion barrier also decreases; and therefore, it becomes difficult to properly prevent the diffusion of a copper constituent by means of the diffusion barrier formed according to the conventional method. Further, in the conventional method described above, it is difficult to increase the thickness of the diffusion barrier so as to improve the characteristics of the diffusion barrier, and due to this fact, the characteristics of the diffusion barrier become worse.

In addition, in the conventional method described above, an overhang phenomenon occurs due to the conglomeration of the copper seed layer formed on the diffusion barrier, and thus the entrance to the metal line forming region can become clogged, whereby voids can be created in the metal line and the characteristics of the metal line deteriorate. As a result, in the conventional method described above, the characteristics and the reliability of a semiconductor device are likely to become worsened.

BRIEF SUMMARY OF THE INVENTION

Embodiments of the present invention include a metal line of a semiconductor device in which the characteristics of a diffusion barrier are improved and a method for forming the same.

Also, embodiments of the present invention include a metal line of a semiconductor device which can improve the characteristics and the reliability of a semiconductor device and a method for forming the same.

In one aspect of the present invention, a metal line of a semiconductor device comprises an insulation layer formed on a semiconductor substrate and having a metal line forming region; a diffusion barrier formed on a surface of the metal line forming region of the insulation layer and having a stack structure of an $Mo_xSi_yN_z$ layer and an Mo layer; and a metal layer formed on the diffusion barrier to fill the metal line forming region of the insulation layer.

In the $Mo_xSi_yN_z$ layer, x is a real number having a range of $0<x\leqq1$, y is a real number having a range of $0<y\leqq1$, and z is a real number having a range of $0<z\leqq1$.

The $Mo_xSi_yN_z$ layer has a thickness of about 10~5,000 Å.

The Mo layer has a thickness of about 5~400 Å.

The metal layer comprises a copper layer.

In another aspect of the present invention, a method for forming a metal line of a semiconductor device comprises the steps of forming an insulation layer on a semiconductor substrate to have a metal line forming region; forming a diffusion barrier on the insulation layer including a surface of the metal line forming region, to have a stack structure of an $Mo_xSi_yN_z$ layer and an Mo layer; and forming a meta layer on the diffusion barrier to fill the metal line forming region.

The step of forming the diffusion barrier comprises the steps of forming a first Mo layer on the insulation layer including a surface of the metal line forming region; converting the first Mo layer into an $Mo_xSi_yN_z$ layer by plasma-processing the first Mo layer; and forming a second Mo layer on the $Mo_xSi_yN_z$ layer.

The first Mo layer is formed to have a thickness of about 5~100 Å.

Plasma processing is conducted using an $SiH_4$ gas and an $NH_3$ gas.

The step of forming the first Mo layer and the step of converting the first Mo layer into the $Mo_xSi_yN_z$ layer by plasma-processing the first Mo layer are repeatedly implemented 2~50 times.

The step of forming the second Mo layer is implemented at a temperature of about −25~100° C.

In the $Mo_xSi_yN_z$ layer, x is a real number having a range of $0<x\leqq1$, y is a real number having a range of $0<y\leqq1$, and z is a real number having a range of $0<z\leqq1$.

The $Mo_xSi_yN_z$ layer is formed to have a thickness of about 10~5,000 Å.

The Mo layer is formed to have a thickness of about 5~400 Å.

The metal layer comprises a copper layer.

BRIEF DESCRIPTION OF THE DRAWINGS

The above and other features and advantages of the present invention will become more apparent to those of ordinary skill in the art by describing in detail exemplary embodiments thereof with reference to the attached drawings, which are not necessarily to scale and in some instances proportions may have been exaggerated in order to more clearly depict certain features of the invention.

DESCRIPTION OF SPECIFIC EMBODIMENTS

Hereafter, specific embodiments of the present invention will be described in detail with reference to the attached drawings.

Figure 1:
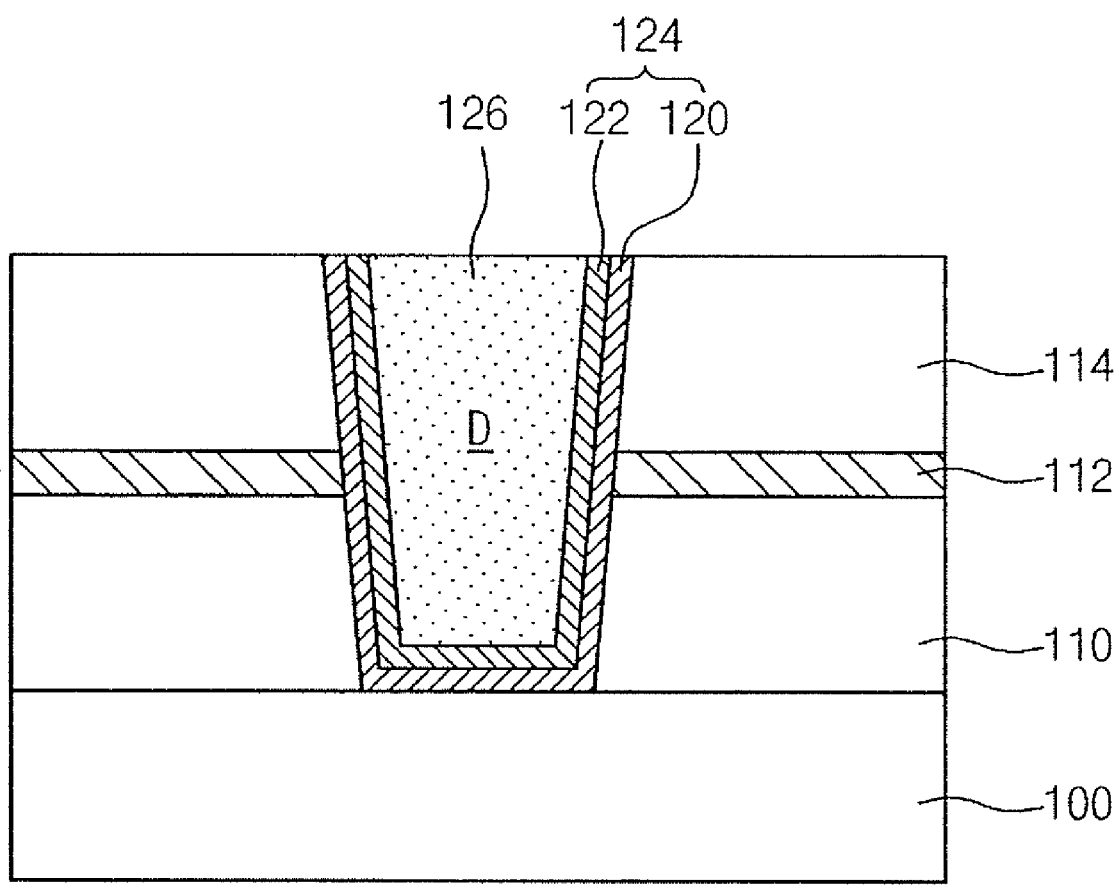
FIG. 1 is a cross-sectional view showing a metal line of a semiconductor device in accordance with an embodiment of the present invention.

FIG. 1 is a cross-sectional view showing a metal line of a semiconductor device in accordance with an embodiment of the present invention.

Referring to FIG. 1, a first insulation layer 110, an etch stop layer 112 and a second insulation layer 114 are sequentially formed on a semiconductor substrate 100 to define a metal line forming region D. In an embodiment of the present invention, the semiconductor substrate 100 is formed with a predetermined understructure (not shown). The metal line forming region D is defined through a single damascene process or a dual damascene process to have a trench structure or a trench and via-hole structure having a trench and at least one via-hole communicating with the trench. In an embodiment of the present invention, the first and second insulation layers 110 and 114 comprise, for example, silicon oxide layers, and the etch stop layer 112 comprises, for example, a silicon nitride layer.

A diffusion barrier 124 comprising the stack structure including an $Mo_xSi_yN_z$ layer 120 and an Mo layer 122 is formed on the surface of the metal line forming region D. In an embodiment of the present invention, in the $Mo_xSi_yN_z$ layer 120, x is a real number having a range of $0<x\leq1$, y is a real number having a range of $0<y\leq1$, and z is a real number having a range of $0<z\leq1$. In an embodiment, the $Mo_xSi_yN_z$ layer 120 has a thickness in the range of 10~5,000 Å, and the Mo layer 122 has a thickness in the range of 5~400 Å. A metal layer 126 is formed on the diffusion barrier 124 to fill the metal line forming region D. The metal layer 126 comprises a copper layer.

Due to the fact that the diffusion barrier 124 has the stack structure including the $Mo_xSi_yN_z$ layer 120 and the Mo layer 122 each of which has an Mo constituent that is never solid-solved in copper, the characteristics of the diffusion barrier 124 are improved when compared to the conventional art. The diffusion barrier 124 according to embodiments of the present invention can sufficiently prevent the diffusion of a copper constituent even when the thickness of the diffusion barrier 124 is small; and therefore, the characteristics of the diffusion barrier 124 can be effectively improved even without increasing the thickness thereof, thereby leading to an improvement in the characteristics and the reliability of a semiconductor device.

Further, the Mo constituent not only has excellent diffusion barrier characteristics but also superior electrical conductivity; therefore, in the present invention, the copper layer can be easily deposited without having to form an additional seed layer on the diffusion barrier 124. Therefore, in the present invention, an overhang phenomenon due to the conglomeration of a seed layer can be prevented, and the creation of voids in the copper layer can be minimized, whereby the characteristics of a metal line can be improved.

FIGS. 2A through 2F are cross-sectional views shown for illustrating the processes of a method for forming a metal line of a semiconductor device in accordance with another embodiment of the present invention. The method will be described below.

Figure 2A:
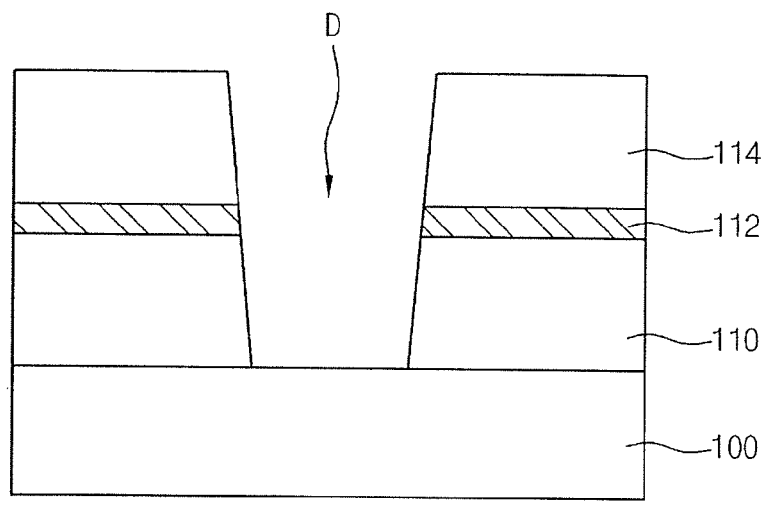
FIGS. 2A through 2F are cross-sectional views shown for illustrating the processes of a method for forming a metal line of a semiconductor device in accordance with another embodiment of the present invention.

Referring to FIG. 2A, a first insulation layer 110, an etch stop layer 112 and a second insulation layer 114 are sequentially formed on a semiconductor substrate 100 which is formed with a predetermined understructure (not shown), such that the understructure is covered. In an embodiment of the present invention, the first and second insulation layers 110 and 114 comprise, for example, silicon oxide layers, and the etch stop layer 112 comprises, for example, a silicon nitride layer.

A metal line forming region D is defined by etching the second insulation layer 114, the etch stop layer 112 and the first insulation layer 110. The metal line forming region D is defined through a single damascene process or a dual damascene process to have a trench structure or a trench and via-hole structure having a trench and at least one via-hole communicating with the trench.

Figure 2B:
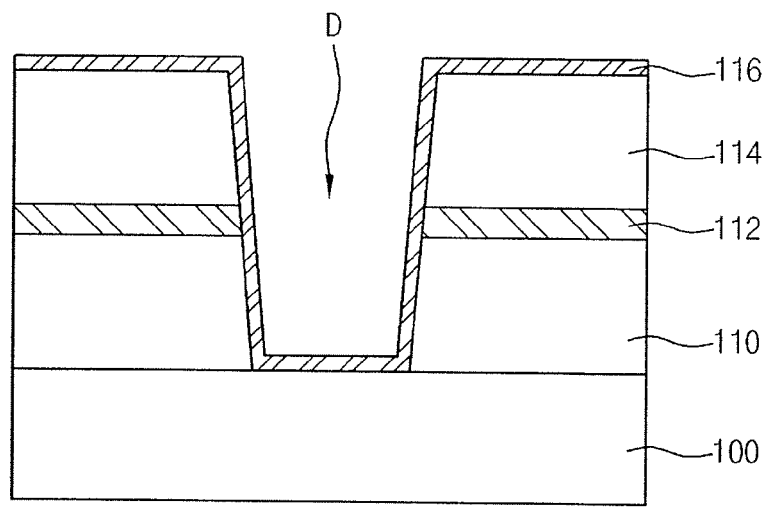

Referring to FIG. 2B, a first Mo layer 116 is formed on the second insulation layer 114 including the surface of the metal line forming region D which is defined in the first and second insulation layers 110, 114 and the etch stop layer 112. In an embodiment of the present invention, the first Mo layer 116 is formed, for example, through chemical vapor deposition (CVD) or physical vapor deposition (PVD), preferably, to a thickness in the range of 5~100 Å.

Figure 2C:
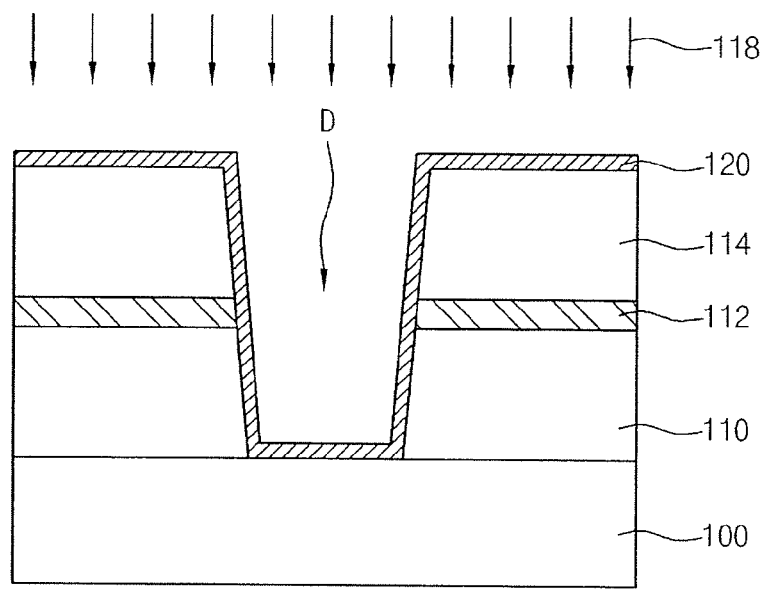

Referring to FIG. 2C, plasma-processing (see the reference numeral 118) is performed on the first Mo layer 116, so that the first Mo layer 116 is converted into an $Mo_xSi_yN_z$ layer 120. The plasma processing 118 of the first Mo layer 116 is implemented, for example, using a mixed gas of an $SiH_4$ gas and an $NH_3$ gas.

In an embodiment of the present invention, the formation of the first Mo layer 116 and the plasma processing 118 of the first Mo layer 116 can be repeatedly conducted 2~50 times until the $Mo_xSi_yN_z$ layer 120 has a desired thickness. As a result, the $Mo_xSi_yN_z$ layer 120 having a thickness of, for example, 10~5,000 Å is formed on the second insulation layer 114 including the surface of the metal line forming region D which is defined in the first and second insulation layers 110 and 114 and the etch stop layer 112.

Figure 2D:
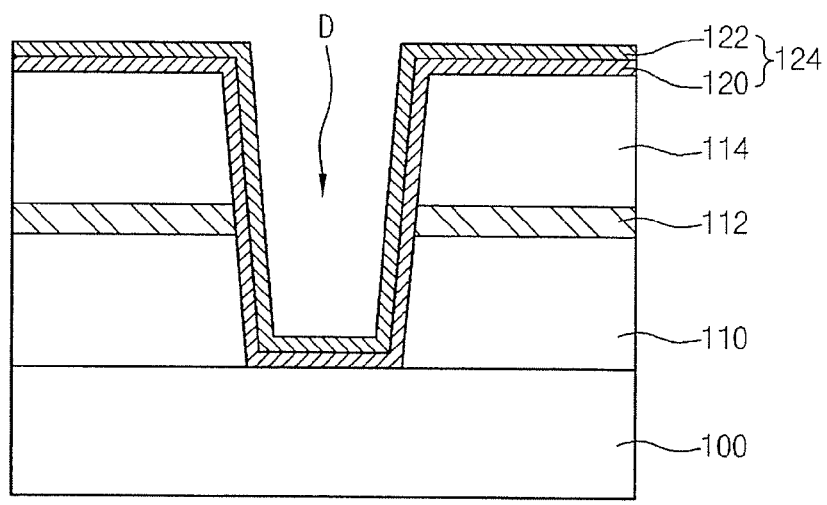

Referring to FIG. 2D, a second Mo layer 122 is formed on the $Mo_xSi_yN_z$ layer 120. The second Mo layer 122 is formed, for example, through CVD or PVD, preferably, at a temperature in the range of −25~100° C. The second Mo layer 122 is formed to have a thickness in the range of 5~400 Å. As a result, a diffusion barrier 124 having the stack structure including the $Mo_xSi_yN_z$ layer 120 and the second Mo layer 122 is formed on the second insulation layer 114 including the surface of the metal line forming region D.

Figure 2E:
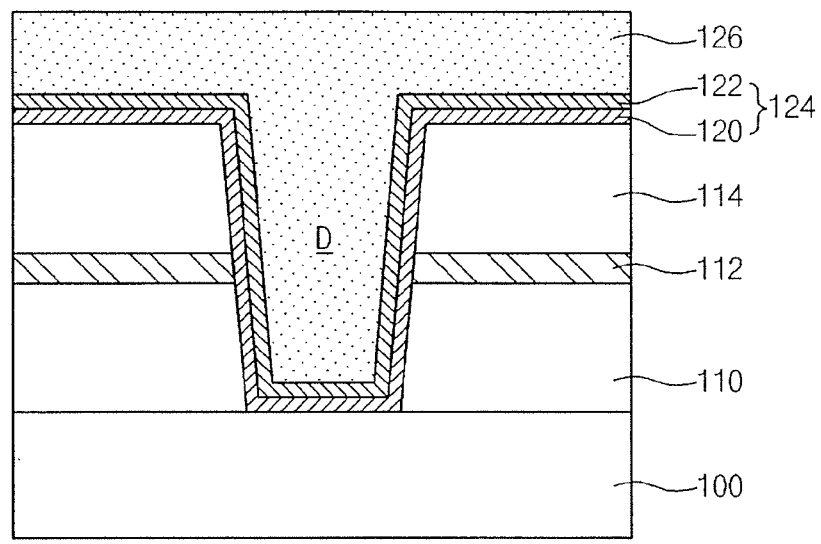

Referring to FIG. 2E, a metal layer 126 is formed on the diffusion barrier 124 to fill the metal line forming region D. In an embodiment of the present invention, the metal layer 126 comprises, for example, a copper layer. The copper layer is formed, preferably, through electroplating. In the embodiment of the present invention, since the diffusion barrier 124 has an Mo constituent which has superior electrical conductivity, the metal layer 126 can be formed even without having to form an additional seed layer on the diffusion barrier 124.

Figure 2F:
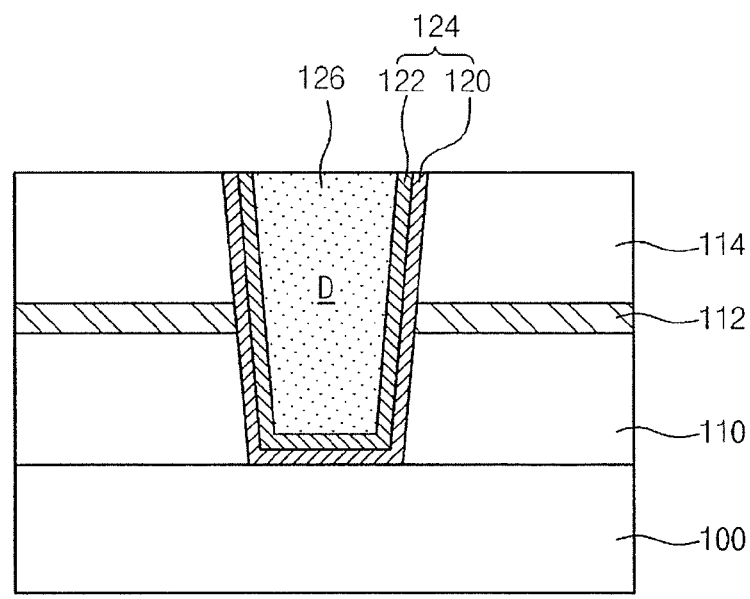

Referring to FIG. 2F, CMPing is performed on the metal layer 126 and the diffusion barrier 124 until the second insulation layer 114 is exposed, and thereby a metal line is formed to fill the metal line forming region D.

Thereafter, while not shown in a drawing, by sequentially conducting a series of well-known subsequent processes, the formation of the metal line of a semiconductor device according to the embodiment of the present invention is completed.

As is apparent from the above description, in embodiments of the present invention, when forming a metal line using a copper layer, a diffusion barrier having the stack structure of an $Mo_xSi_yN_z$ layer and an Mo layer is formed.

Since an Mo constituent is never solid-solved in copper, excellent characteristics for preventing the diffusion of a copper constituent can be accomplished. Therefore, in the present invention, the characteristics of the diffusion barrier comprising the stack structure including the $Mo_xSi_yN_z$ layer and the Mo layer are improved. Thus, in the present invention, the diffusion of the copper layer can be effectively prevented even when the diffusion barrier has a small thickness when compared to the conventional art.

Also, the Mo constituent not only has the excellent diffusion barrier characteristics but also has superior electrical conductivity; therefore, in the present invention, it is not necessary to form an additional seed layer on the diffusion barrier. According to this fact, in the present invention, when compared to the conventional art in which a seed layer is formed on the diffusion barrier, the thickness of the diffusion barrier can be decreased to about one half, whereby the present invention can be advantageously applied to the manufacturing process of a highly integrated semiconductor device.

In addition, in the present invention, an overhang phenomenon which occurs in the conventional art due to the conglomeration of a seed layer can be reduced; and therefore, the creation of voids in the copper layer due to the clogging of the entrance to a metal line forming region can be minimized, and through this, the characteristics of the metal line can be improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A metal line of a semiconductor device, comprising:
  an insulation stack layer on a semiconductor substrate that defines a metal line forming region which exposes a portion of the semiconductor substrate, wherein the insulation stack layer comprises:
    a first insulation layer formed directly on the semiconductor substrate;
    an etch stop layer formed directly on the first insulation layer;
    a second insulation layer formed directly on the etch stop layer;
  a diffusion barrier formed on a surface of the metal line forming region of the insulation stack layer, the diffusion barrier comprising a stack structure including an $Mo_xSi_yN_z$ layer directly formed so as to cover a bottom of the metal line forming region and directly formed on sidewalls of the metal line forming region of the insulation stack layer and an Mo layer entirely formed on the $Mo_xSi_yN_z$ such that the Mo layer is directly formed on the $Mo_xSi_yN_z$ later in the bottom of the metal line forming region and directly formed on the sidewalls of the $Mo_xSi_yN_z$ later in the metal line forming region; and
  a metal layer directly formed on the diffusion barrier in the metal line forming region of the insulation stack layer without a seed layer interposed between the metal layer and the metal line forming region.

2. The metal line according to claim 1, wherein the metal line forming region is defined within the insulation layer, and the metal layer is formed on the diffusion barrier to fill the metal line forming region.

3. The metal line according to claim 1, wherein, in the $Mo_xSi_yN_z$ layer, x is a real number having a range of $0<x\leqq1$, y is a real number having a range of $0<y\leqq1$, and z is a real number having a range of $0<z\leqq1$.

4. The metal line according to claim 1, wherein the $Mo_xSi_yN_z$ layer has a thickness in the range of 10~5,000 Å.

5. The metal line according to claim 1, wherein the Mo layer has a thickness in the range of 5~400 Å.

6. The metal line according to claim 1, wherein the metal layer comprises a copper layer.

7. A method for forming a metal line of a semiconductor device, comprising the steps of:
  forming an insulation stack layer having a metal line forming region on a semiconductor substrate, wherein the insulation stack layer comprises:
    a first insulation layer formed directly on the semiconductor substrate;
    an etch stop layer formed directly on the first insulation layer;
    a second insulation layer formed directly on the etch stop layer;
  forming a diffusion barrier comprising a stack structure including an $Mo_xSi_yN_z$ layer formed so as to cover a bottom of the metal line forming region and directly formed on sidewalls of the metal line forming region of the insulation stack layer and a second Mo layer entirely formed on the $Mo_xSi_yN_z$ layer on the insulation stack layer including on a surface of the metal line forming region such that the Mo layer is directly formed on the $Mo_xSi_yN_z$ later in the bottom of the metal line forming region and directly formed on the sidewalls of the $Mo_xSi_yN_z$ layer in the metal line forming region, wherein forming the diffusion barrier comprises:
    forming a first Mo layer on the insulation layer included on the surface of the metal line forming region;
    plasma-processing the first Mo layer to convert the first Mo layer into the $Mo_xSi_yN_z$ layer, wherein plasma-processing conducted using an $SiH_4$ gas and an $NH_3$ gas; and
    forming the second Mo layer on the $Mo_xSi_yN_z$ layer; and
  forming a metal layer directly on the diffusion barrier in the metal line forming region without a seed layer interposed between the metal layer and the metal line forming region.

8. The method according to claim 7, wherein the step of forming an insulation layer having a metal line forming region comprises etching the insulation layer such that the metal line forming region is defined within the insulation layer, and wherein the metal line is formed on the diffusion barrier to fill the metal line forming region defined in the insulation layer.

9. The method according to claim 7, wherein the first Mo layer is formed to have a thickness in the range of 5~100 Å.

10. The method according to claim 7, wherein the step of forming the first Mo layer and the step of converting the first Mo layer into the $Mo_xSi_yN_z$ layer by plasma-processing the first Mo layer are repeatedly implemented 2~50 times.

11. The method according to claim 7, wherein the step of forming the second Mo layer is formed through CVD or PVD at a temperature in the range of −25~100° C.

12. The method according to claim 7, wherein, in the $Mo_xSi_yN_z$ layer, x is a real number having a range of $0<x\leqq1$, y is a real number having a range of $0<y\leqq1$, and z is a real number having a range of $0<z\leqq1$.

13. The method according to claim 7, wherein the $Mo_xSi_yN_z$ layer is formed to have a thickness in the range of 10~5,000 Å.

14. The method according to claim 7, wherein the second Mo layer is formed to have a thickness in the range of 5~400 Å.

15. The method according to claim 7, wherein the metal layer comprises a copper layer.

16. The method according to claim 15, wherein the copper layer is formed through electroplating.

* * * * *